United States Patent
Leung

(10) Patent No.: US 7,330,038 B2
(45) Date of Patent: Feb. 12, 2008

(54) INTERLEAVED MEMS-BASED PROBES FOR TESTING INTEGRATED CIRCUITS

(75) Inventor: Omar S. Leung, Palo Alto, CA (US)

(73) Assignee: Silicon Light Machines Corporation, San Jose, CA (US)

( * ) Notice: Subject to any disclaimer, the term of this patent is extended or adjusted under 35 U.S.C. 154(b) by 0 days.

(21) Appl. No.: 11/296,248

(22) Filed: Dec. 7, 2005

(65) Prior Publication Data

US 2006/0125503 A1    Jun. 15, 2006

Related U.S. Application Data

(60) Provisional application No. 60/636,004, filed on Dec. 14, 2004.

(51) Int. Cl.
*G01R 31/02*    (2006.01)
(52) U.S. Cl. .................................... 324/754
(58) Field of Classification Search ............ None
See application file for complete search history.

(56) References Cited

U.S. PATENT DOCUMENTS

| | | | |
|---|---|---|---|
| 5,061,033 A | 10/1991 | Richard | |
| 5,070,297 A | 12/1991 | Kwon et al. | |
| 5,380,318 A | 1/1995 | Daikuzono | |
| 5,477,160 A | 12/1995 | Love | |
| 5,600,257 A | 2/1997 | Leas et al. | |
| 5,807,767 A | 9/1998 | Stroupe | |
| 5,850,148 A | 12/1998 | Nam | |
| 5,929,651 A | 7/1999 | Leas et al. | |
| 6,064,213 A | 5/2000 | Khandros et al. | |
| 6,075,373 A | 6/2000 | Iino | |
| 6,084,215 A | 7/2000 | Furuya et al. | |
| 6,130,104 A | 10/2000 | Yamasaka | |
| 6,208,155 B1 | 3/2001 | Barabi et al. | |
| 6,246,245 B1 | 6/2001 | Akram et al. | |
| 6,400,173 B1 | 6/2002 | Shimizu et al. | |
| 6,452,411 B1 | 9/2002 | Miller et al. | |
| 6,469,530 B1 | 10/2002 | Johnson et al. | |
| 6,483,330 B1 | 11/2002 | Kliner | |
| 6,527,563 B2 | 3/2003 | Clayton | |
| 6,528,350 B2* | 3/2003 | Fork | 438/117 |
| 6,531,335 B1 | 3/2003 | Grigg | |
| 6,551,844 B1 | 4/2003 | Eldridge et al. | |
| 6,559,666 B2 | 5/2003 | Bernier et al. | |
| 6,658,728 B2 | 12/2003 | Fork et al. | |
| 6,759,865 B1 | 7/2004 | Gu et al. | |
| 6,799,976 B1 | 10/2004 | Mok et al. | |
| 6,815,961 B2* | 11/2004 | Mok et al. | 324/754 |
| 6,847,218 B1 | 1/2005 | Nulty et al. | |

* cited by examiner

*Primary Examiner*—Ha Tran Nguyen
*Assistant Examiner*—Trung Q. Nguyen
(74) *Attorney, Agent, or Firm*—Okamoto & Benedicto LLP

(57) ABSTRACT

In one embodiment, a probe card includes a substrate and a plurality of probes. Each of the probes may have a supported portion and an unsupported portion that meet at a base. The unsupported portion may have a non-uniform (e.g. triangular) cross-section along a length that begins at the base. The probes may be interleaved and fabricated using MEMS fabrication techniques.

10 Claims, 8 Drawing Sheets

INTERLEAVED MEMS-BASED PROBES FOR TESTING INTEGRATED CIRCUITS

CROSS-REFERENCE TO RELATED APPLICATION

This application claims the benefit of U.S. Provisional Application No. 60/636,004, filed on Dec. 14, 2004, which is incorporate herein by reference in its entirety.

BACKGROUND OF THE INVENTION

1. Field of the Invention

The present invention relates generally to methods and apparatus for testing integrated circuits, and more particularly but not exclusively to test probes.

2. Description of the Background Art

Probe cards are employed in integrated circuit (IC) testing. A probe card includes a substrate that supports multiple probes for contacting corresponding pads on an integrated circuit die (also referred to as a "chip"). Generally speaking, the probe card provides an interface between a test equipment (e.g. an automated test equipment or "ATE") and the integrated circuit die under test (DUT).

FIG. 1 schematically illustrates an example array of conventional probes 11. Each probe 11 typically has a supported portion (not shown) attached to a probe card substrate and an unsupported portion 13 that flexes upon contact with a die pad. Only the unsupported portions 13 are shown in FIG. 1 for clarity of illustration. The length of an unsupported portion 13 of each probe 11 is shown as L, the width of each probe 11 is shown as w, and the pitch between probes 11 is shown as P. In FIG. 1, each probe 11 has an unsupported portion 13 with uniform cross-section (rectangular in FIG. 1). Each unsupported portion 13 includes a tip 12. The tips 12, which may be integral or separately attached, physically contact corresponding pads on a die under test to make an electrical connection.

The probes 11 are pre-stressed to curve or extend outwardly from a planar surface of a substrate (e.g. printed circuit board) of a probe card. The probes 11 can be formed and released, for example, using Micro-Electromechanical Systems (MEMS) fabrication techniques. When the wafer containing the die is raised or moved toward the probe card beyond the point at which the first pads on the die first come into contact with the probes 11, the probes 11 flex so as to allow the tips 12 of the other probes 11 to contact pads on the die, thereby compensating for small variations in planarity or parallelism between the probe card and the die on the surface of the wafer. The movement of the wafer past the point at which the tips 12 contact pads on the die and the resultant flexing of the probes 11 also cause the tips 12 to scrub across their respective pads, thereby removing oxide buildup on the pads and improving electrical connection between the probe card and the die.

One problem with the probes 11 is that they suffer from low stiffness. Another problem is that as the probes 11 flatten against the substrate of the probe card, van der Waals force can cause the probes 11 to be held against the surface of the probe card substrate, possibly degrading the probe card or rendering it unusable.

One approach to addressing the above problems is to form the probes with unsupported portions projecting over one of a number of cavities formed on the surface of the probe card substrate. While this approach reduces the potential for van der Waals forces, it does not address the low stiffness of rectangular beams formed using MEMs techniques and it can decrease the force applied to the die and test.

FIG. 2 schematically shows an example conventional MEMS-based probe with uniform cross-section unsupported portions under different load conditions. In the example of FIG. 2, the profile 21 represents a side view of the probe under no load condition, the profile 22 represents a side view of the probe under medium load condition, and the profile 23 represents a side view of the probe under maximum load condition. In FIG. 2, the vertical axis represents height and the horizontal axis represents distance. The height at unit 0 represents the surface of the probe card substrate; the die under test (not shown) would be at positive units of height above 0. As load is applied to the probe upon contact with a pad of the die under test, the probe flexes towards the probe card substrate as illustrated by the transition from profile 21 to profile 22 then to profile 23.

In FIG. 2, the load applied to the probe is uniform, and the profile of the probe in unloaded, pre-stressed condition (profile 21) is cylindrical. From FIG. 2, it can be seen that for an end loaded cantilever beam probe with uniform cross-section (e.g. probe 11), the moment (M(x)) is greatest at base and is given by the following equation:

$$M(x) = \frac{(FL - Fx)}{w} \qquad (Eq.\ 1)$$

where F is the force applied at the tip of the probe, L is the length of the unsupported portion of the probe, x is the distance along the length and w is the width of the probe.

The deflection (y(x)) of a cantilever beam probe with uniform cross-section is cubic and given by the following equation:

$$y(x) = \frac{F}{6BI}(3x^2 L - x^3) \qquad (Eq.\ 2)$$

where B is the modulus I is the moment of inertia, F is the force applied at the tip of the probe, L is the length of the unsupported portion of the probe, and x is the distance along the length.

As illustrated by the profile 23, the probe can deflect below the probe card substrate under high load conditions. If the probe is on a probe card substrate that has no cavity below the unsupported portion of the probe, the probe will come into contact with the probe card substrate. This may damage the probe or cause the probe to stick to the probe card substrate and thus interfere with the test operation. If, however, the unsupported portion of the probe is over a cavity, the unsupported portion of the probe will curve into the cavity below the plane of the probe card substrate, undesirably further decreasing the force applied to the die under test and consequently reducing the scrubbing action of the tip of the probe on the pad of the die. The incorporation of cavities also increases the cost of fabricating the probe card.

SUMMARY

In one embodiment, a probe card includes a substrate and a plurality of probes. Each of the probes may have a supported portion and an unsupported portion that meet at a base. The unsupported portion may have a non-uniform (e.g.

triangular) cross-section along a length that begins at the base. The probes may be interleaved and fabricated using MEMS fabrication techniques.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of apparatus, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 3:
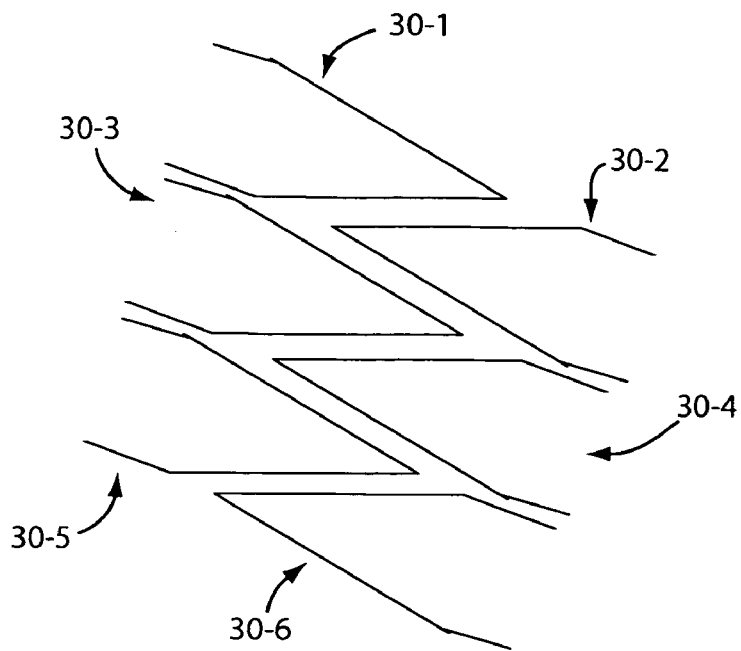
FIG. 3 schematically illustrates a perspective view of MEMS-based probes prior to releasing their unsupported portions in accordance with an embodiment of the present invention.

FIG. 3 schematically illustrates a perspective view of MEMS-based probes 30 (i.e., 30-1, 30-2, . . . ) prior to releasing their unsupported portions in accordance with an embodiment of the present invention. As will be more apparent in FIG. 4, each probe 30 has an unsupported portion 32 (i.e., 32-1, 32-2, . . . ) that is configured to flex upon contact with a die pad and a supported portion 31 (i.e. 31-1, 31-2, . . . ) attached to the probe card substrate. Each probe 30 is configured to contact a corresponding pad on a die under test. In the example of FIG. 3, the probes 30 are for testing an array of pads in a single line. The probes 30 may be arranged as two sets of side-by-side probes. In the example of FIG. 3, probes 30-1, 30-3, and 30-5 form a first set of side-by-side probes, while probes 30-2, 30-4, and 30-6 form a second set of side-by-side probes. The probes 30 from the first set are interleaved with the probes 30 from the second set. Interleaving the probes 30 decreases the pitch between probes, thereby increasing probe packing density. For example, the pitch between probes 30 may be about half a width of a probe 30 measured at a base where its supported and unsupported portions meet. This makes the probes 30 particularly useful in testing integrated circuit dies with closely spaced pads. Only six probes 30 are shown in FIG. 3 for clarity of illustration. More or less probes 30 may be employed depending on the application.

Figure 4:
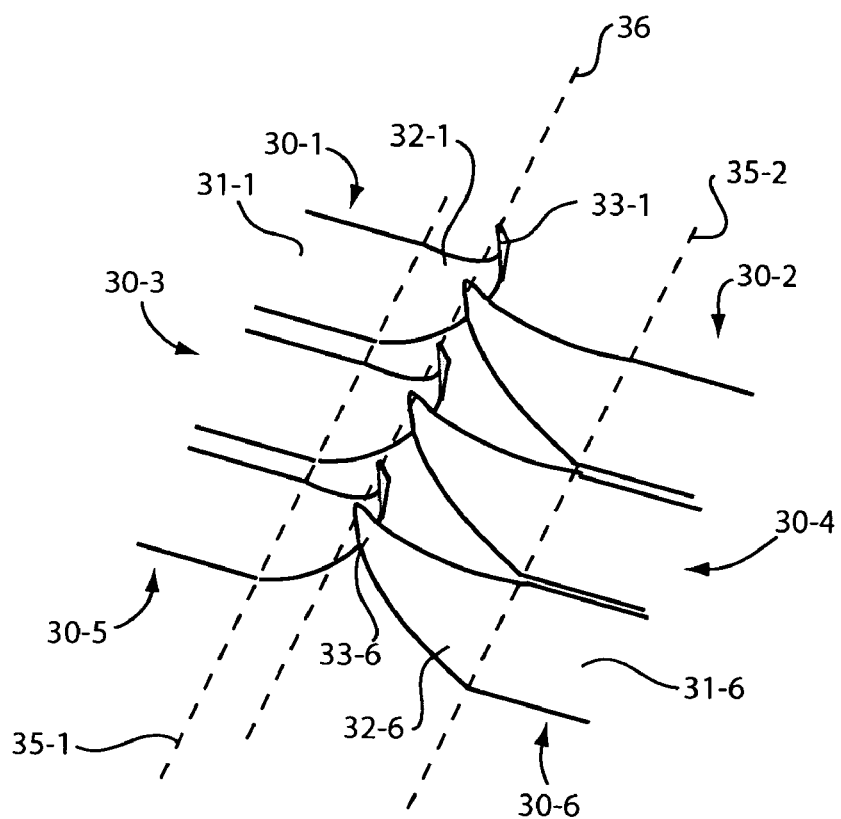
FIG. 4 schematically illustrates the probes of FIG. 3 after their unsupported portions have been released.

FIG. 4 schematically illustrates the probes 30 after their unsupported portions 32 have been released. Each probe 30 includes a supported portion 31 and an unsupported portion 32. A supported portion 31 fixedly attaches the probe 30 to its substrate to allow the unsupported portion 32 to flex upon contact of a tip 33 (i.e., 33-1, 33-2, . . . ) with a pad. As an example, the probe 30-1 includes a supported portion 31-1 and an unsupported portion 32-1, which includes a tip 33-1. As another example, the probe 30-6 includes a supported portion 31-6 and an unsupported portion 32-6, which includes a tip 33-6. Note that some components have not been labeled in FIG. 4 for clarity of illustration.

In one embodiment, the distance between two adjacent tips 33 (i.e. pitch) is about 80 microns, the length of an unsupported portion 32 (measured when flattened) is about 300 microns, and the amount of lift of each tip 33 is about 300 microns +/−100 microns.

Still referring to FIG. 4, releasing the unsupported portions 32 causes them to curl up from a base line 35 (i.e. 35-1, 35-2) marking the interface between the supported portions 31 and the unsupported portions 32. As will be more apparent below, the supported portions 31 and the unsupported portions 32 may be integrally formed. The unsupported portions 32 curl up upon release due to stress gradient in the layers of materials forming the probes 11. The tips 33 line up along a dashed line 36 to contact die pads arranged in a single line. Additional sets of probes 30 may be employed to contact die pads arranged in another line. The probes 30 shown in FIG. 4 are interleaved in that the probes 30 having bases on line 35-2 (i.e. probes 30-2, 30-4, and 30-6) alternate with the probes 30 having bases on line 35-1 (i.e. probes 30-1, 30-3, and 30-5), with the tips 33 of the probes 30 lining up in the line 36 between the base lines 35-1 and 35-2.

Each unsupported portion 32 may have a non-uniform cross-section, which decreases along a length beginning from the base line 35 and going to the apex of the tip 33 (or in other embodiments, up to the beginning of the tip 33). This advantageously allows an unsupported portion 32 to have more material at its base for more strength and less material at its tip for more flexibility. In the example of FIG. 4, each unsupported portion 32 has a triangularly shaped cross-section. The triangular shape allows for interleaving for increased probe packing density and for the benefits of employing a non-uniform cross-section.

Figure 5A:
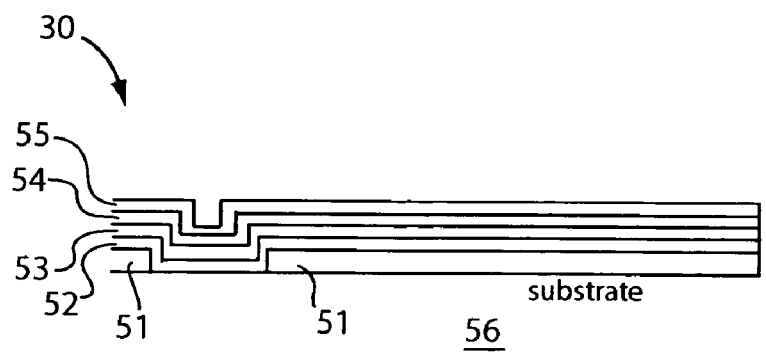
FIGS. 5A, 5B, and 5C schematically show side cross-sectional views of a probe being fabricated using a method in accordance with an embodiment of the present invention.
Figure 5B:
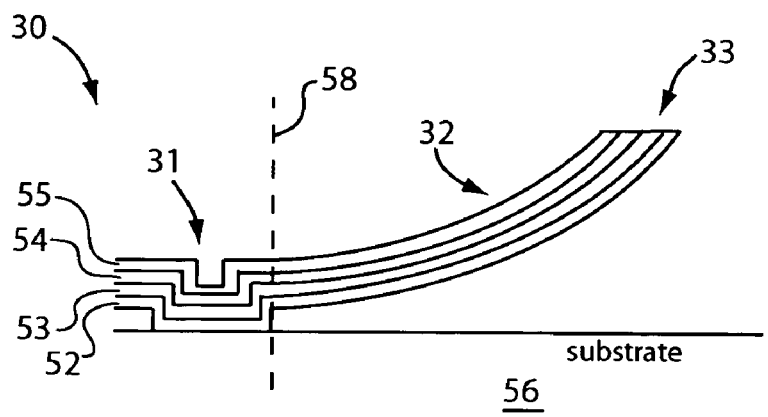
Figure 5C:
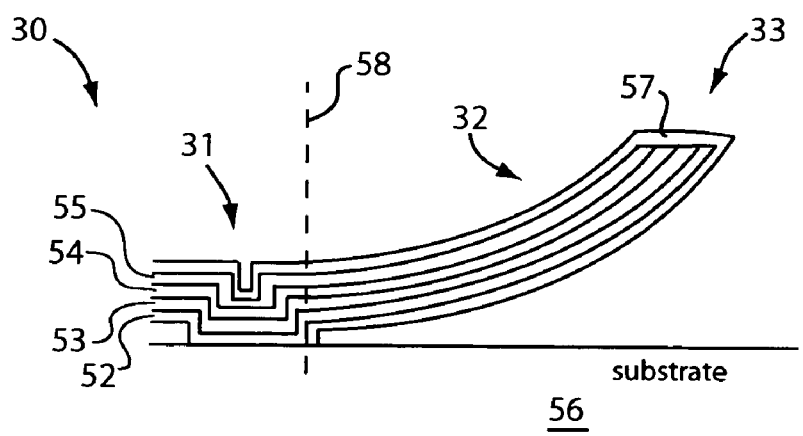

FIGS. 5A, 5B, and 5C schematically show side cross-sectional views of a probe 30 being fabricated using a method in accordance with an embodiment of the present invention. The processing steps of FIGS. 5A, 5B, and 5C may be performed using conventional MEMS fabrication techniques. In FIG. 5A, a sacrificial layer 51 is formed over a substrate 56, which may be a silicon wafer, for example. The sacrificial layer 51 may comprise a material that is preferentially etched by a noble gas fluoride, such as xenon difluoride. In one embodiment, the sacrificial layer 51 comprises amorphous silicon formed to a thickness of about 0.3 microns.

An electroplating adhesion layer 52 is formed over the sacrificial layer 51. The electroplating adhesion layer 52 facilitates electroplating of the probe 30 after the sacrificial layer 51 is etched away in a subsequent release step. The electroplating adhesion layer 52 may comprise aluminum formed to a thickness of about 200 to 500 Angstroms.

A compressive layer 53 is formed over the electroplating adhesion layer 52. The compressive layer 53 may comprise tungsten formed to a thickness of about 0.1 to 0.5 microns.

A tensile layer 54 is formed over the compressive layer 53. The tensile layer 54 may comprise tungsten formed to a thickness of about 0.1 to 0.5 microns. These layers function together to cause lift of the probe.

An electroplating adhesion layer 55 is formed over the tensile layer 54. Similar to the electroplating adhesion layer 52, the electroplating adhesion layer 55 facilitates electroplating of the probe 30. The electroplating adhesion layer 55 may comprise aluminum formed to a thickness of about 200 to 500 Angstroms.

In FIG. 5B, the unsupported portion 32 of the probe 30 is released by etching the sacrificial layer 51. In one embodiment, a sacrificial layer 51 comprising amorphous silicon is etched using xenon difluoride. The etching of the sacrificial layer 51 causes the unsupported portion 32 to curl up due to stress gradient in the aforementioned layers of materials forming the probe 30. The supported portion 31 remains fixedly attached to the substrate 56 after the unsupported portion 32 is released. FIG. 5B also shows the tip 33 and a dashed line 58 marking the division between supported portion 31 and the unsupported portion 32. The base of the unsupported 32 is generally along the dashed line 58 and the end of the unsupported 32 is the tip 33.

In FIG. 5C, a conductive coating 57 is formed on the probe 30. In one embodiment, the conductive coating 57 comprises nickel electroplated on the probe 30 to a thickness of about 10 microns.

Figure 5D:
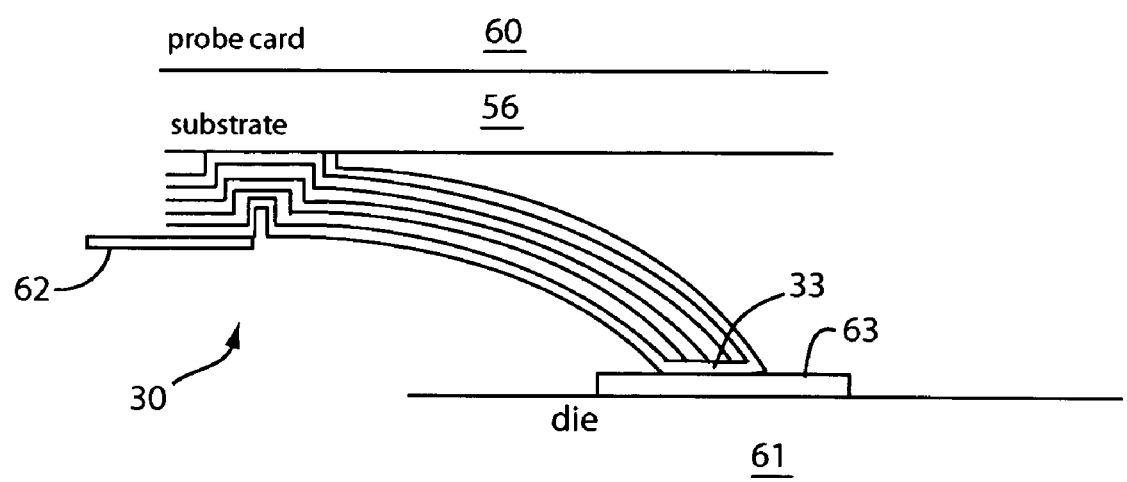
FIG. 5D schematically shows the use of a probe in accordance with an embodiment of the present invention.

FIG. 5D schematically shows the probe 30 being used to test a die 61. The die 61 may be a die in a plurality of dies on a semiconductor wafer. The tip 33 of the probe 30 contacts a pad 63 of the die 61. The pad 63 may be coupled to circuitry within the die. Electrical signals propagate between the probe card 60 and the pad 63 by way of the probe 30. A conductive wire 62 electrically couples the probe 30 to the probe card 60. In the example of FIG. 5D, the substrate 56 serves as the substrate of the probe card 60. The substrate 56 may also be processed to be attachable to a printed circuit board (PCB) that may serve as the probe card substrate. Other ways of mounting the probe 30 to probe cards may also be employed without detracting from the merits of the present invention. The probe card 60 may incorporate test circuitry and interfaces for electrically coupling to a test equipment. Probe cards are also disclosed in the following commonly-assigned disclosures, which are incorporated herein by reference in their entirety: U.S. Pat. No. 6,847,218; U.S. Pat. No. 6,759,865; and U.S. application Ser. No. 10/784,566, filed on Feb. 23, 2004.

Figure 6:
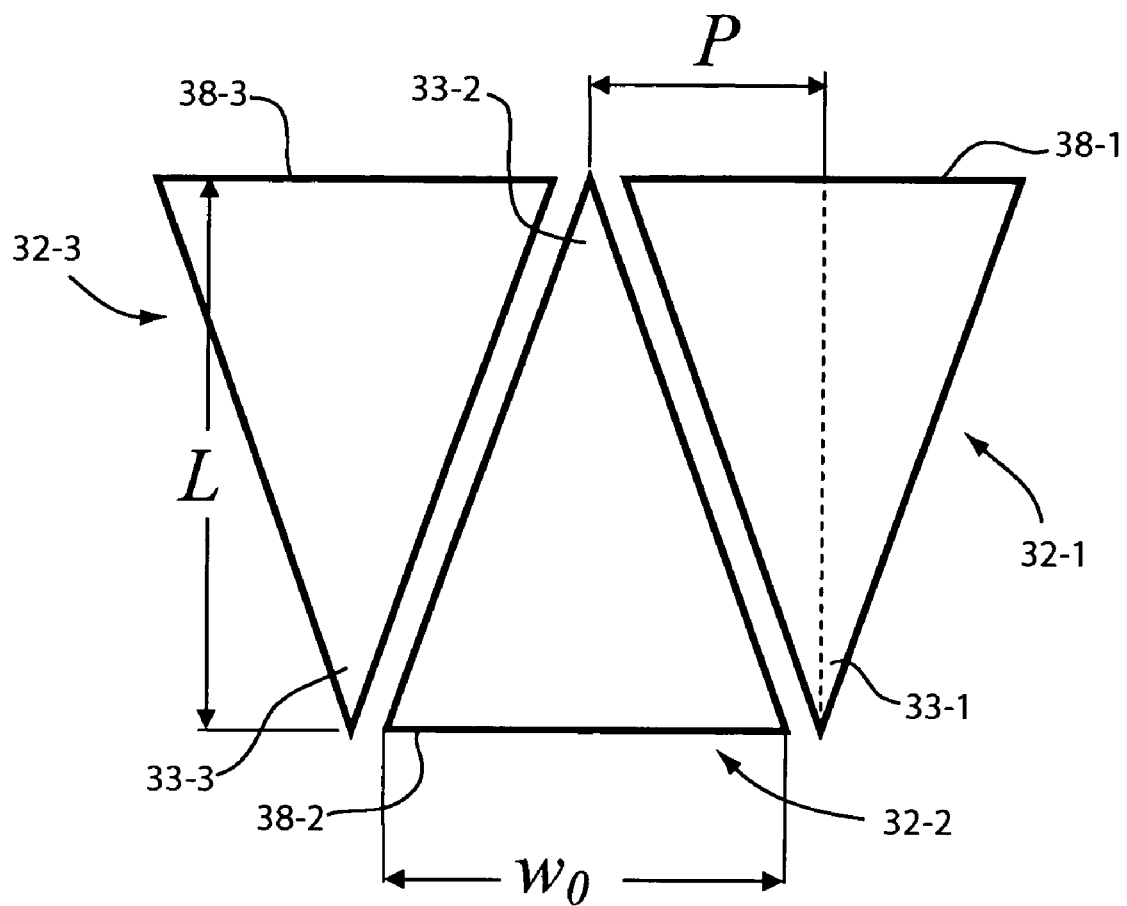
FIG. 6 schematically shows a top view of unsupported portions of probes, before being released, in accordance with an embodiment of the present invention.

FIG. 6 schematically shows a top view of unsupported portions 32 of probes 30, before being released, in accordance with an embodiment of the present invention. As shown in FIG. 6, an unsupported portion 32 extends from a base 38 (i.e. 38-1, 38-2, . . . ) to a tip 33. A base 38 provides a rough demarcation line between a supported portion 31 (see FIG. 4) and an unsupported portion 32 of a probe 30. That is, a supported portion 31 and an unsupported portion 32 meet at a base 38. In the example of FIG. 6, each unsupported portion 32 has a non-uniform cross-section that decreases along a length that begins on the base 38 and extends to the tip 33. This allows an unsupported portion 32 to have more material at its base 38 for strength and less material as it extends away from the base for flexibility. In the example of FIG. 6, each unsupported portion 32 has a triangular shape from its base 38 to the apex of its tip 33. An unsupported portion 32 preferably has a triangular shape to allow the unsupported portion 32 to maintain a cylindrical profile as it is stressed.

Figure 1:
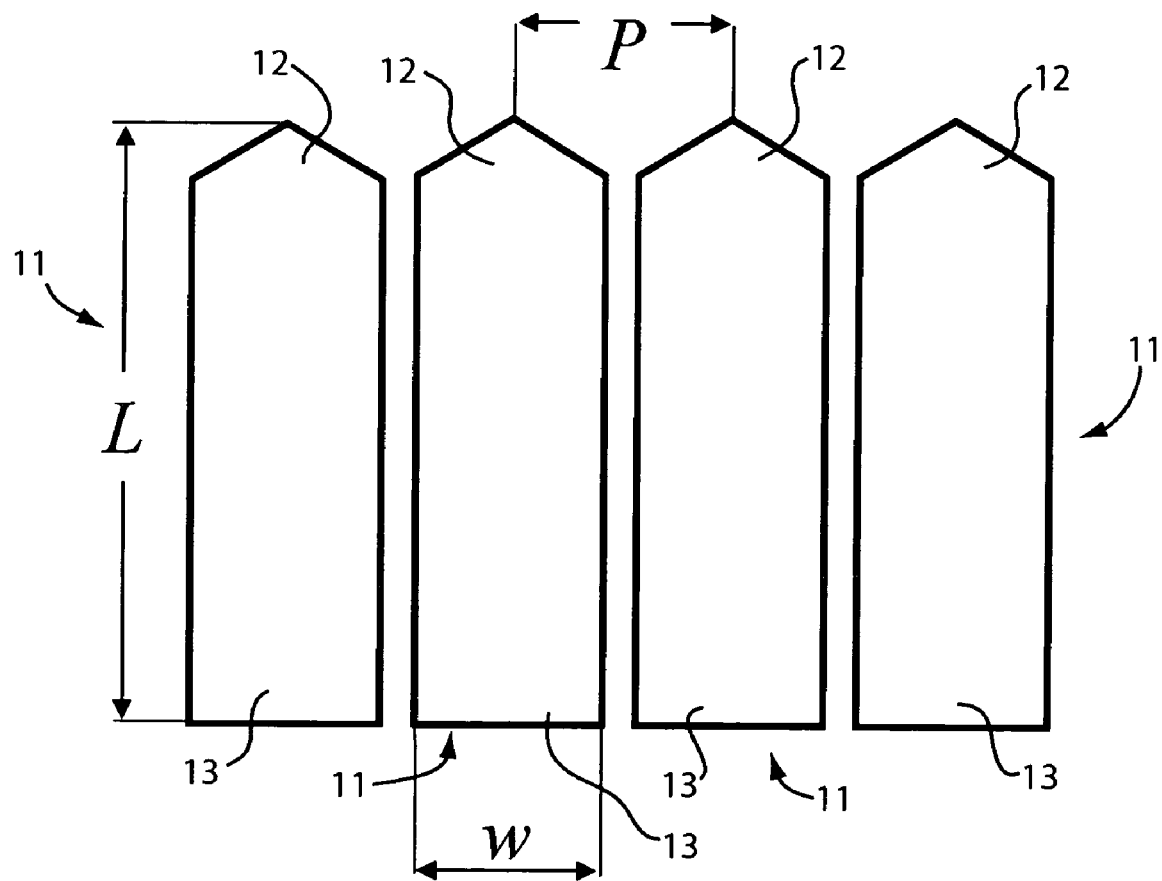
FIG. 1 schematically illustrates an example array of conventional probes.
Figure 2:
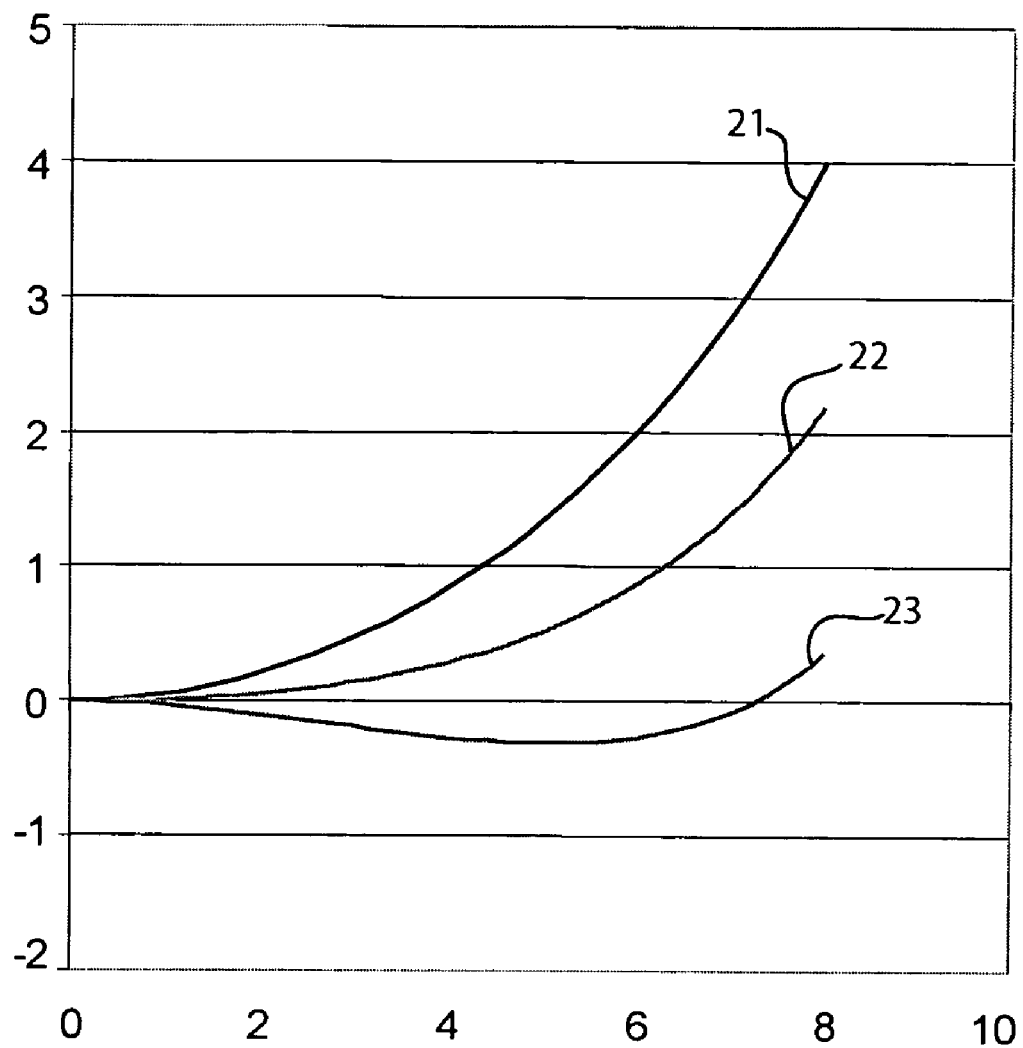
FIG. 2 schematically shows profiles of an example conventional MEMS-based probe with uniform cross-section under different load conditions.

In the example of FIG. 6, the unsupported portions 32 are interleaved. The unsupported portion 32-2 is interleaved with unsupported portions 32-1 and 32-3, with the base 32-2 along a first line and the bases 38-1 and 38-3 along a second line that is substantially in parallel with the first line. When the unsupported portions 32-1, 32-2, and 32-3 are released, the tips 33-1, 33-2, and 33-3 curl up substantially along a third line between the first and second lines (see FIG. 4). In FIG. 6, P is the pitch between unsupported portions 32 as measured from their tips 33, L is the length of an unsupported portion 32, and $w_0$ is the width of an unsupported portion 32 as measured from its base 38. From FIG. 6, note that the pitch P of the unsupported portions 32 can be half the width $w_0$. Comparing FIG. 1 with FIG. 6, it can be seen that interleaving unsupported portions 32 advantageously allow them to be positioned closer to each other.

Figure 7:
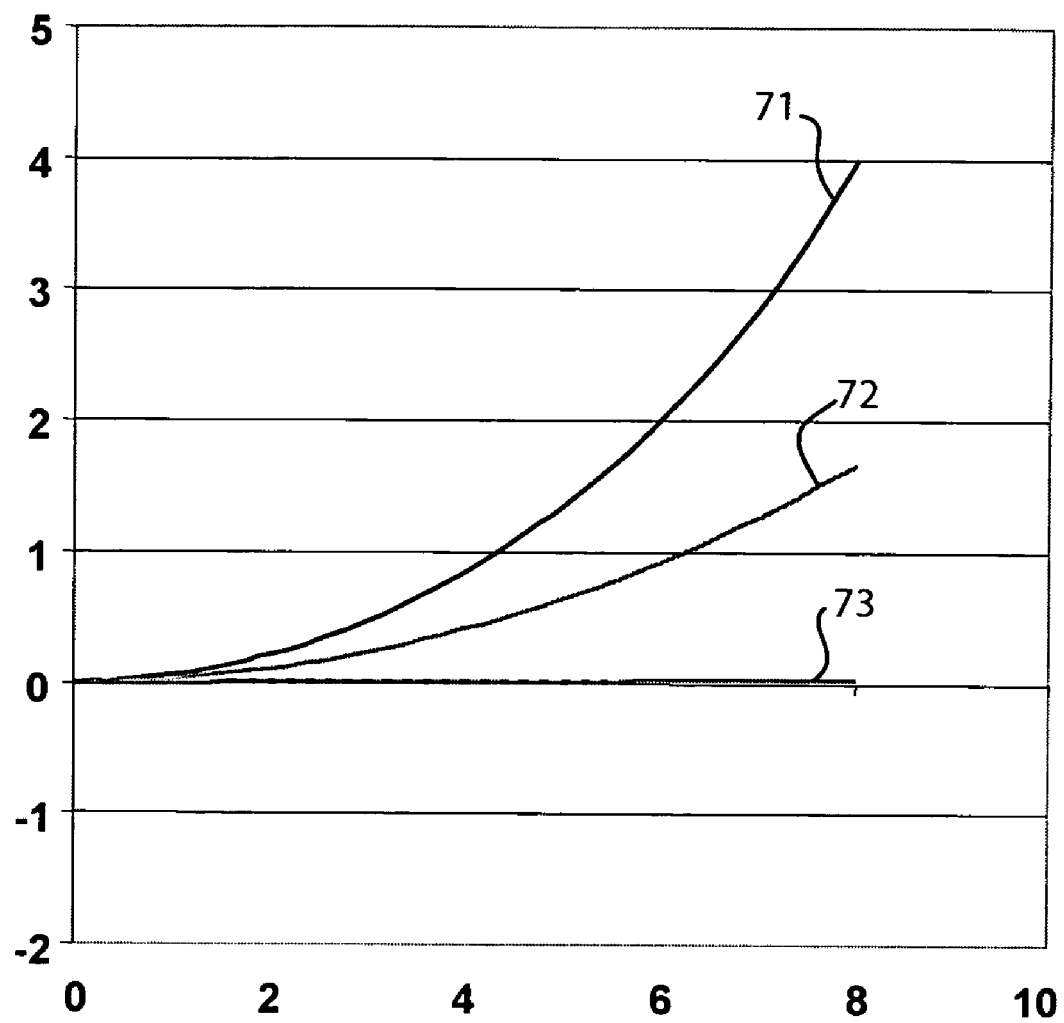
FIG. 7 schematically shows profiles of a probe in accordance with an embodiment of the present invention under different load conditions.

FIG. 7 schematically shows profiles of a probe 30 (see FIG. 4) under different load conditions. In FIG. 7, the profile 71 represents a side view of the probe 30 under no load condition, the profile 72 represents a side view of the probe 30 under medium load condition, and the profile 73 represents a side view of the probe 30 under maximum load condition. In FIG. 7, the vertical axis represents height and the horizontal axis represents distance. The height at unit 0 represents the surface of the probe card substrate; the die under test (not shown) would be at positive units of height above 0. As uniform load is applied to the probe 30 upon contact with a pad of the die under test, the probe 30 flexes towards the probe card substrate as illustrated by the transition from profile 71 to profile 72 then to profile 73. The triangular shape of the unsupported portion 32 of the probe 30 allows the probe 30 to maintain a cylindrical profile as load is applied on its tip. This advantageously allows the probe 30 to remain above height 0 to minimize contact with the probe card substrate, even as the probe 30 is pressed towards the probe card substrate. As shown in FIG. 7, the probe 30 uniformly flattens on the probe card substrate under high load conditions (see profile 73), thus minimizing van der Waals force related problems.

From FIG. 7, it can be seen that for an end loaded probe 30 with non-uniform cross-section unsupported portion 32, the moment (M) is given by the following equation:

$$M = \frac{FL}{w_0} \quad \text{(Eq. 3)}$$

where $w_0$ is the width of the unsupported portion 32 at its base 38 (see FIG. 6), F is the force applied at the tip 33 of unsupported portion 32, and L is the length of the unsupported portion 32. Equation 3 shows that the moment of an unsupported portion 32 is uniformly constant, thus advantageously allowing for a cylindrical profile under load. In contrast, as is evident from equation 1, the moment of a conventional uniform cross-section probe varies and is greatest at the base of its unsupported portion.

The probes 30 also allow for improved uniformity and controllability of vertical compliance, which is the reciprocal of stiffness. The compliance C of a probe 30 with non-uniform cross-section unsupported portion 32 is given by equation 4:

$$C = \frac{\text{deflection}}{\text{force}} = \frac{6L^3}{Bw_0 t^3} \quad \text{(Eq. 4)}$$

where B is Pl. Str. Modulus, L is the length of the unsupported portion 32, $w_0$ is the width of the unsupported portion 32 as measured from its base 38, and t is thickness.

In contrast, the compliance of a conventional probe with a uniform cross-section unsupported portion is given by equation 5:

$$C = \frac{4L^3}{Bwt^3} \quad \text{(Eq. 5)}$$

where B is Pl. Str. Modulus, L is the length of the unsupported portion of the conventional probe, w is the width of the conventional probe, and t is thickness.

Comparing equations 4 and 5, it can be seen that the initial compliance of the probe 30 is about 25% lower (i.e. stiffer) than that of the conventional probe for a given pitch ($w_0$ is 2× greater than w). This advantageously allows the probe 30 to make positive contact with a pad of a die under test.

Figure 8A:
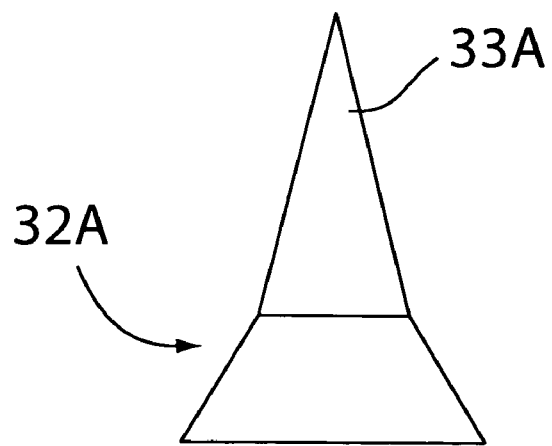
FIGS. 8A, 8B, and 8C schematically show example tip configurations in accordance with embodiments of the present invention.
Figure 8B:
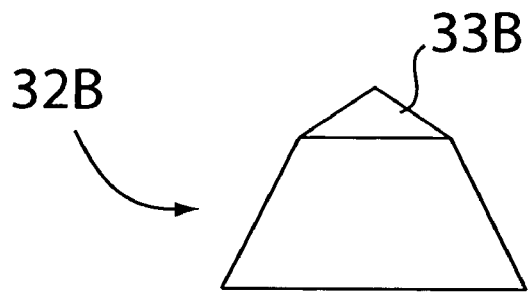
Figure 8C:
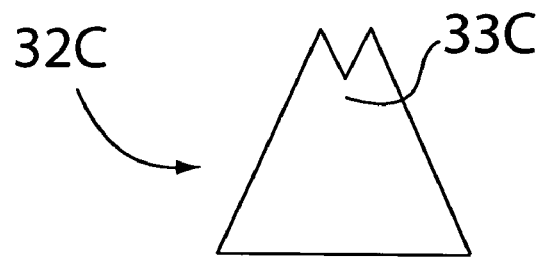

FIGS. 8A, 8B, and 8C schematically show example tip configurations in accordance with embodiments of the present invention. In FIG. 8A, an unsupported portion 32A, which is a specific embodiment of an unsupported portion 32 (see FIG. 6), includes a tip 33A. Tip 33A is an example of a tip 33 that has an aggressive slope compared to the rest of the unsupported portion. In FIG. 8B, an unsupported portion 32B, which is a specific embodiment of an unsupported portion 32, includes a tip 33B. Tip 33B is an example of a tip 33 that has a gentler slope compared to the rest of the unsupported portion. In FIG. 8C, an unsupported portion 32C, which is a specific embodiment of an unsupported portion 32, includes a tip 33C. Tip 33C is an example of a tip 33 that has multiple contact points for better contact with the die pad. Other tip configurations may also be employed without detracting from the merits of the present invention.

The advantages of using MEMS-base probes, which was impractical heretofore due to problems with low stiffness and van der Waals forces, include: (i) the potential for large scale probe manufacture; (ii) improved tolerances for macroscopic probe cards; and (iii) the ability to combine fabrication of probes by MEMS techniques with manufacturing of active circuitry on the probe card for signal analysis.

The advantages of interleaved probes according to the present invention over conventional approaches include: (i) increased and controlled probe stiffness; (ii) stiffness that is linear with deflection; (iii) more vertical stiffness for a given pitch and length; (iv) higher stiffness for better contact; (v) smaller pitch; (vi) the ability to control unsupported portion length as a tradeoff between lift and stiffness; (vii) no or substantially no contact with the probe card substrate under high load conditions, thereby reducing potential for damage due to van der Waals forces; (viii) linear stiffness with deflection; (ix) the ability to operate in a non-contact mode; and (x) greater lateral strength.

Improved MEMS-based probes for testing integrated circuits have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. An apparatus for testing an integrated circuit, the apparatus comprising:
   a substrate;
   a plurality of probes formed on the substrate, each of the probes being configured to contact a corresponding pad on a die, each of the probes having a supported portion fixedly attached to the substrate and an unsupported portion that flexes upon contact with a die pad, the unsupported portion having a non-uniform cross-section along its entire length that begins at a base where the supported portion and the unsupported portion meet;
   wherein the probes comprise a first set of probes and a second set of probes, the first set of probes having unsupported portions that have bases along a first line, the second set of probes having unsupported portions that have bases along a second line, and the first and second sets of probes having tips for contacting pads on the die and that curl up along a same third line that is between the first line and the second line as viewed from a perspective view of the first and second sets of probes.

2. The apparatus of claim 1 wherein the unsupported portions of the first and second sets of probes each has a triangular shape.

3. The apparatus of claim 1 wherein the first and second sets of probes are interleaved and configured to test an array of die pads arranged along a single line.

4. The apparatus of claim 1 wherein the unsupported portions of the first and second sets of probes each includes a tip with a single contact point.

5. The apparatus of claim 1 wherein the unsupported portions of the first and second sets of probes each includes a tip with more than one contact point.

6. The apparatus of claim 1 wherein each probe in the first and second sets of probes comprises:
   a compressive layer;
   a tensile layer formed on the compressive layer; and
   a conductive coating electroplated on the compressive layer and the tensile layer.

7. The apparatus of claim 6 wherein the compressive layer and the tensile layer comprise tungsten and the conductive coating comprises nickel.

8. The apparatus of claim 6 further comprising an electroplating adhesion layer formed to the tensile layer and the compressive layer.

9. The apparatus of claim 8 wherein the electroplating adhesion layer comprises aluminum.

10. The apparatus of claim 1 wherein each probe in the first and second sets of probes is configured to maintain a cylindrical profile as load is applied to it.

* * * * *